United States Patent
Wada

(10) Patent No.: US 9,080,253 B2
(45) Date of Patent: Jul. 14, 2015

(54) METHOD FOR MANUFACTURING EPITAXIAL WAFER

(75) Inventor: Naoyuki Wada, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 1393 days.

(21) Appl. No.: 12/352,790

(22) Filed: Jan. 13, 2009

(65) Prior Publication Data

US 2009/0205562 A1 Aug. 20, 2009

(30) Foreign Application Priority Data

Feb. 19, 2008 (JP) ................. 2008-036880

(51) Int. Cl.
*C30B 25/02* (2006.01)
*C30B 25/10* (2006.01)
*H01L 21/02* (2006.01)
*H01L 21/67* (2006.01)
*C30B 25/12* (2006.01)
*C30B 29/06* (2006.01)

(52) U.S. Cl.
CPC .............. *C30B 25/10* (2013.01); *C30B 25/02* (2013.01); *C30B 25/12* (2013.01); *C30B 29/06* (2013.01); *H01L 21/02532* (2013.01); *H01L 21/67248* (2013.01)

(58) Field of Classification Search
CPC ............... H01L 21/02532; H01L 21/67248; C30B 25/10; C30B 29/06; C30B 25/02
USPC .......................... 117/84, 85, 88, 89
See application file for complete search history.

(56) References Cited

U.S. PATENT DOCUMENTS

| 5,790,750 | A | * | 8/1998 | Anderson | 392/416 |
| 6,072,164 | A | * | 6/2000 | Tate et al. | 219/497 |
| 6,143,629 | A | * | 11/2000 | Sato | 438/455 |
| 2007/0190757 | A1 | * | 8/2007 | Nakamura et al. | 438/507 |
| 2009/0226293 | A1 | | 9/2009 | Nasu et al. | |

FOREIGN PATENT DOCUMENTS

| JP | 10-294287 | 11/1998 |
| JP | 2000-269137 | 9/2000 |
| JP | 2006-123560 | 12/2006 |
| WO | 2007/004550 | 1/2007 |

OTHER PUBLICATIONS

Patent Abstracts of Japan. English Abstract and Computer translaton of JP 2000-269137 (2000).*
English Language Abstract of JP 10-294287.
(Continued)

*Primary Examiner* — Matthew Song
(74) *Attorney, Agent, or Firm* — Greenblum & Bernstein, P.L.C.

(57) ABSTRACT

In a method for manufacturing an epitaxial wafer by which an epitaxial layer is formed on a surface of a silicon wafer arranged in a reactor by distributing a raw material gas in the reactor, a temperature of a susceptor at the time of carrying the silicon wafer into the reactor is adjusted in accordance with a resistivity of the silicon wafer. There is provided the method for manufacturing an epitaxial wafer, the method enabling reduction in generation of particles from friction of a back surface edge portion and the susceptor due to warpage of the wafer caused at the time of carriage into the reactor and occurrence of scratches on the silicon wafer back surface edge portion without requiring a complicated apparatus.

5 Claims, 3 Drawing Sheets

(56) References Cited

OTHER PUBLICATIONS

English Language Abstract of JP 2000-269137.

Korea Office action that issued with respect to patent family member Korean Patent Application No. 10-2009-0012899, dated Nov. 17, 2010 along with an english translation thereof.

* cited by examiner

METHOD FOR MANUFACTURING EPITAXIAL WAFER

BACKGROUND OF THE INVENTION

1. Field of the Invention

The present invention relates to a method for manufacturing an epitaxial wafer formed of a silicon wafer and an epitaxial layer, the silicon wafer being loaded on a susceptor of an epitaxial growth apparatus to have the epitaxial layer formed on a main surface thereof while being rotated.

2. Description of the Related Art

In a method for manufacturing an epitaxial wafer, there is known that, when a silicon wafer is carried into a reactor having a high-temperature atmosphere by using a carrier blade of an epitaxial growth apparatus having an automatic carriage function, elastic deformation, i.e., so-called warpage is produced in the silicon wafer due to a thermal stress.

When the silicon wafer is loaded on a susceptor in a state where this warpage is produced, a back surface edge portion of the silicon wafer and the susceptor graze each other to generate particles and also produce extraneous materials at the time of remedying the warpage on the susceptor. Adherence of the extraneous materials to the silicon wafer is a serious problem in a manufacturing process.

To solve such a problem, there is disclosed a method for transferring a silicon wafer characterized in that a state where warpage of a heated and warped silicon wafer has been remedied is confirmed and then the silicon wafer is transferred onto a wafer support when transferring the silicon wafer to the wafer support from a carriage member through a transfer member (see, e.g., Japanese Patent Document 1).

Further, to solve the problem, as a technology that avoids warpage itself produced in a silicon wafer, there are disclosed a semiconductor manufacturing apparatus and a wafer handling method, the apparatus including controlling means for controlling heating by heating means to reduce a temperature difference between a front surface and a back surface of the silicon wafer and the apparatus executing an epitaxial growth process (see, e.g., Japanese Patent Document 2).

Patent Document 1

Japanese Examined Patent Application Publication No. Hei 10-294287 (claim 6)

Patent Document 2

Japanese Unexamined Patent Application Publication No. 2000-269137 (claim 3, claim 6)

However, in the invention disclosed in Patent Document 1, a remedy for warpage of the silicon wafer is carried out by a control unit. The control unit confirms a shape of a specific region of the silicon wafer when warped and a shape of the specific region of the same when not warped by comparing images from monitoring means, and transfers the silicon wafer from the silicon transfer member to the wafer support after confirming both the shapes. Therefore, the apparatus is complicated, a large cost is required to make alterations to the apparatus, and holding is required until the warped silicon wafer is restored into an original shape, thus involving a time loss in a manufacturing process.

Furthermore, in the invention disclosed in Patent Document 2, heating by the heating means is controlled in such a manner that a temperature difference between the front surface and the back surface of the silicon wafer is reduced to avoid warpage itself of the silicon wafer. Therefore, like Patent Document 1, the apparatus is complicated, and a large cost is required to make alterations to the apparatus. Moreover, since an effect is reduced and warpage of the silicon wafer becomes prominent as an outside diameter of the silicon wafer is increased, the above-explained problem cannot be solved in the silicon wafer having a large outside diameter.

SUMMARY OF THE INVENTION

Accordingly, the object of the present invention is to provide a method for manufacturing an epitaxial wafer, the method enabling a reduction of occurrence of particles due to friction of a back surface edge portion and a susceptor caused by warpage of a silicon wafer when carried into a reactor and occurrence of scratches on the silicon wafer back surface edge portion.

According to a first aspect of the present invention, there is provided a method for manufacturing an epitaxial wafer by which an epitaxial wafer is formed on a surface of a silicon wafer arranged in a reactor by distributing a raw material gas in the reactor, wherein a temperature of a susceptor at the time of carrying the silicon wafer into the reactor is adjusted in accordance with a resistivity of the silicon wafer.

According to the first aspect of the present invention, when a temperature of the susceptor at the time of carriage into the reactor is adjusted in accordance with a resistivity of the silicon wafer, warpage of the silicon wafer caused due to a thermal stress can be remedied within a fixed time from transfer onto lift pins to transfer onto the susceptor after the silicon wafer is carried into the reactor, and hence occurrence of particles produced due to frication of a back surface edge portion and the susceptor and occurrence of scratches on the silicon wafer back surface edge portion can be reduced without requiring a complicated apparatus.

According to a second aspect of the present invention, as the invention defined in claim 1, there is provided the method for manufacturing an epitaxial wafer, wherein, when the resistivity of the silicon wafer is 0.005 to 0.020 Ω·cm, a temperature of the susceptor at the time of carrying the silicon wafer into the reactor is adjusted to 775±25° C.

According to a third aspect of the present invention, as the invention defined in claim 1, there is provided the method for manufacturing an epitaxial wafer, wherein, when the resistivity of the silicon wafer is 8 to 12 Ω·cm, a temperature of the susceptor at the time of carrying the silicon wafer into the reactor is adjusted to 825±250° C.

According to the present invention, in the method for manufacturing an epitaxial wafer by which the epitaxial layer is formed on the surface of the silicon wafer arranged in the reactor by distributing a raw material gas in the reactor, when a temperature of the susceptor at the time of carrying the silicon wafer into the reactor is adjusted in accordance with a resistivity of the silicon wafer, friction of the back surface edge portion and the susceptor due to warpage of the silicon wafer caused at the time of carriage into the reactor can be avoided without requiring a complicated apparatus, and occurrence of particles caused by this friction and of scratches on the silicon wafer back surface edge portion can be reduced.

DETAILED DESCRIPTION OF THE PREFERRED EMBODIMENTS

Preferred embodiments according to the present invention are described in more details with reference to the attached drawings hereinafter.

Figure 1:
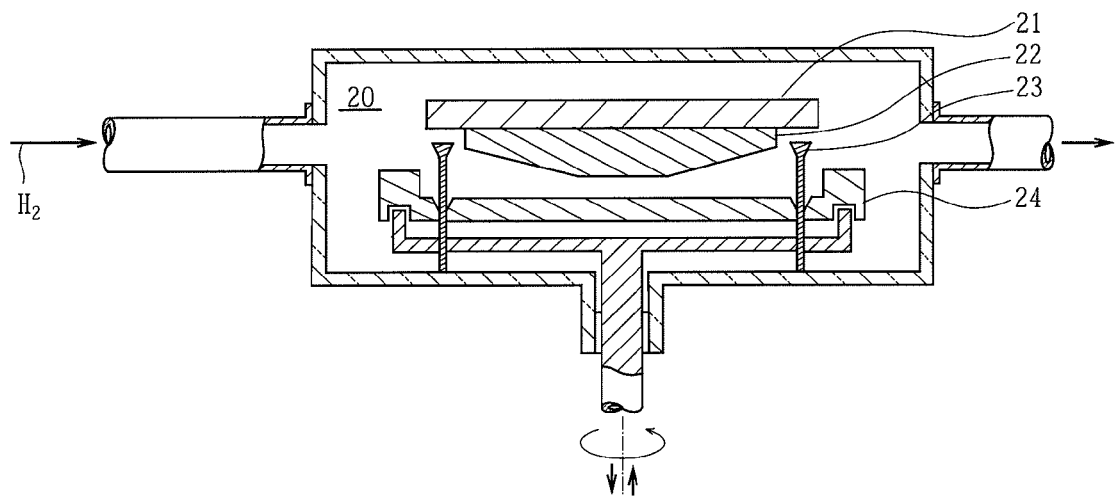
FIG. 1 is a schematic view showing a process in a method for manufacturing an epitaxial wafer.
Figure 2:
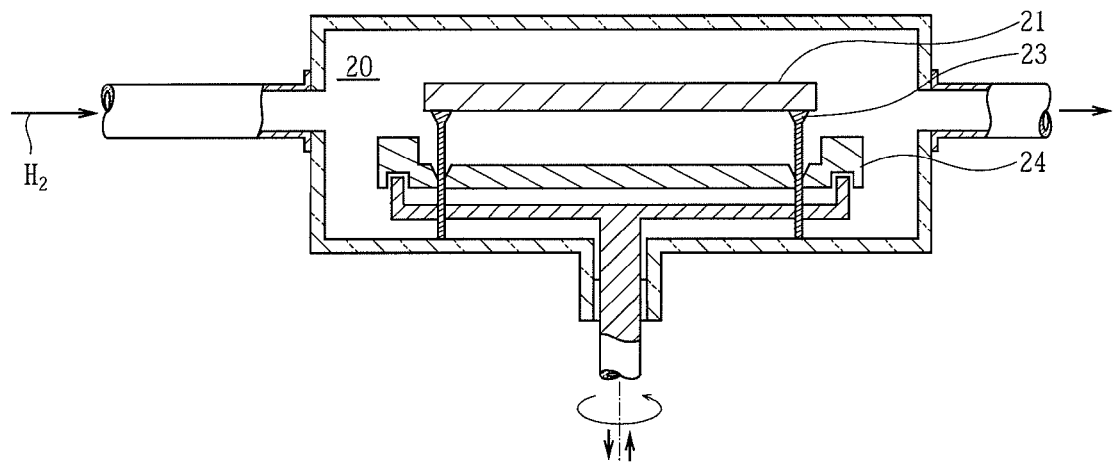
FIG. 2 is a schematic view showing a process in the method for manufacturing an epitaxial wafer.
Figure 3:
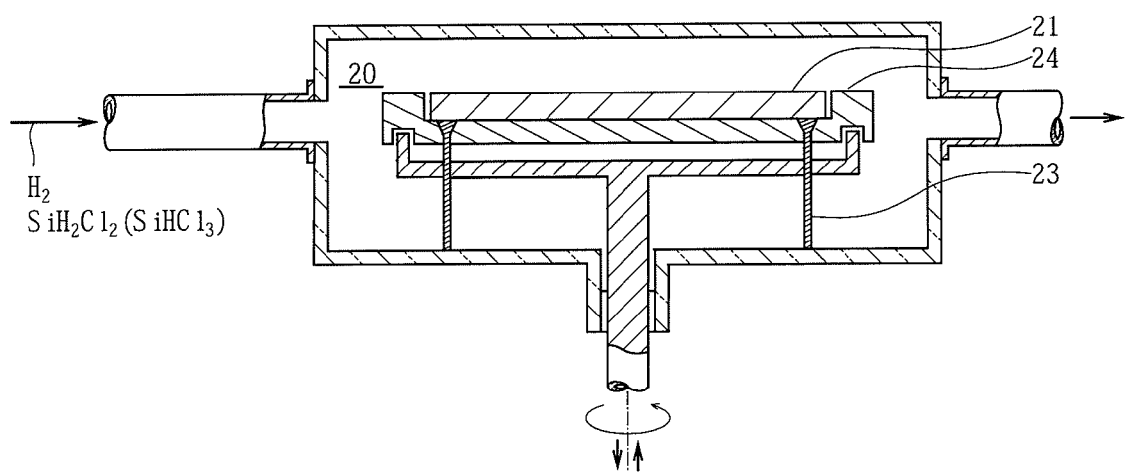
FIG. 3 is a schematic view showing a process in the method for manufacturing an epitaxial wafer.

A method for manufacturing a general epitaxial wafer will now be explained with reference to FIGS. 1 to 3. FIGS. 1 to 3 are views schematically showing processes from carriage of a silicon wafer into a reactor of an epitaxial growth apparatus to transfer onto a susceptor.

First, as shown in FIG. 1, a silicon wafer 21 having an ordinary temperature that becomes a substrate of an epitaxial wafer is loaded on a carrier blade 22. Then, the silicon wafer 21 is carried together with the carrier blade 22 into a reactor 20 of an epitaxial growth apparatus having a high temperature. The silicon wafer 21 that has been carried into the reactor 20 is temporarily relayed by lift pins 23 disposed in the reactor 20 as shown in FIG. 2. Subsequently, the silicon wafer 21 relayed by the lift pins 23 is transferred onto a susceptor 24 as shown in FIG. 3. An epitaxial layer is formed on a front surface of the silicon wafer 21 transferred onto the susceptor 24 in a subsequent process.

Figure 4:
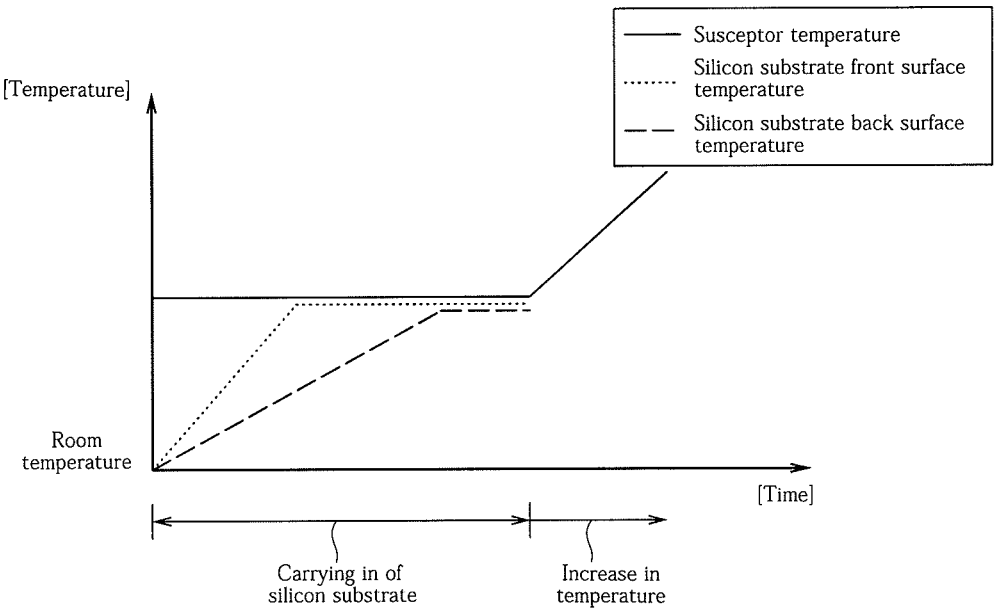
FIG. 4 is a schematic view showing temperature rise rates of a front surface and a back surface of a silicon wafer carried into a general epitaxial growth apparatus.

A conventional problem arises from occurrence of elastic deformation, i.e., so-called warpage in the silicon wafer 21 due to a thermal stress when the silicon wafer 21 having an ordinary temperature is carried into the reactor 20 of the epitaxial growth apparatus having a high temperature. FIG. 4 is a view schematically showing temperature rises rates of a front surface and a back surface of the silicon wafer 21 when the silicon wafer 21 is carried into the reactor 20 of the epitaxial growth apparatus having a high temperature in the general epitaxial growth apparatus where the susceptor 24 in the reactor 20 is set to a fixed value. Here, the back surface means a surface on a side that is supported by the carrier blade 22 or the lift pins 23. Warpage of the silicon wafer 21 carried into the reactor 20 occurs due to a difference in temperature rise rate between the front surface and the back surface as shown in FIG. 4, and convex warpage occurs on the front surface side having a higher temperature rise rate. This warpage temporarily occurs due to a temperature difference between the front surface and the back surface and it is remedied when temperatures on both the surfaces become uniform. When this remedy for warpage occurs after transfer from the lift pins 23 to the susceptor 24, a back surface edge portion of the convexly warped silicon wafer 21 and a surface of the susceptor 24 graze each other to generate particles. The generated particles become a factor of an LPD (Light Point Defect) on the surface of the epitaxial wafer to be formed. In the present invention, the LPD means a point defect that is detected by using a laser beam scattering particle counter (SP1: manufactured by KLA-Tencor).

The present invention solves the problem caused due to warpage of the silicon wafer 21 in processes from carriage of the silicon wafer 21 into the reactor 20 to transfer of the same onto the susceptor 24 depicted in FIGS. 1 to 3 in manufacturing processes in the method for manufacturing an epitaxial wafer.

As a result of keenly performed studies, the present inventors have revealed that a temperature rise rate varies depending on a resistivity of the silicon wafer since a temperature of the silicon wafer immediate after carriage into the reactor varies depending on a resistivity of the silicon wafer. That is, when a temperature in the reactor is fixed, since a temperature rise rate varies depending on a resistivity of the silicon wafer, a time required for recovery of the silicon wafer after occurrence of warpage also varies depending on a resistivity of the silicon wafer. The invention disclosed in Patent Document 1 pays attention to a time difference from occurrence of this warpage to recovery and solves the above-explained problem. However, since a relationship between a resistivity and a temperature rise rate of the silicon wafer is not revealed in this invention, a complicated control apparatus that detects recovery from the warpage based on a monitor image of each silicon wafer is required as explained above. Therefore, a considerable cost is required to make alterations to the apparatus, and a time loss in a manufacturing process is also involved.

Thus, the present invention takes notice of a point that a temperature rise rate of the silicon wafer is dependent on a resistivity of the silicon wafer, and solves the above-explained problem by adjusting a temperature of the susceptor in accordance with a resistivity of the silicon wafer and remedying warpage produced in the silicon wafer within a fixed time range.

Figure 5:
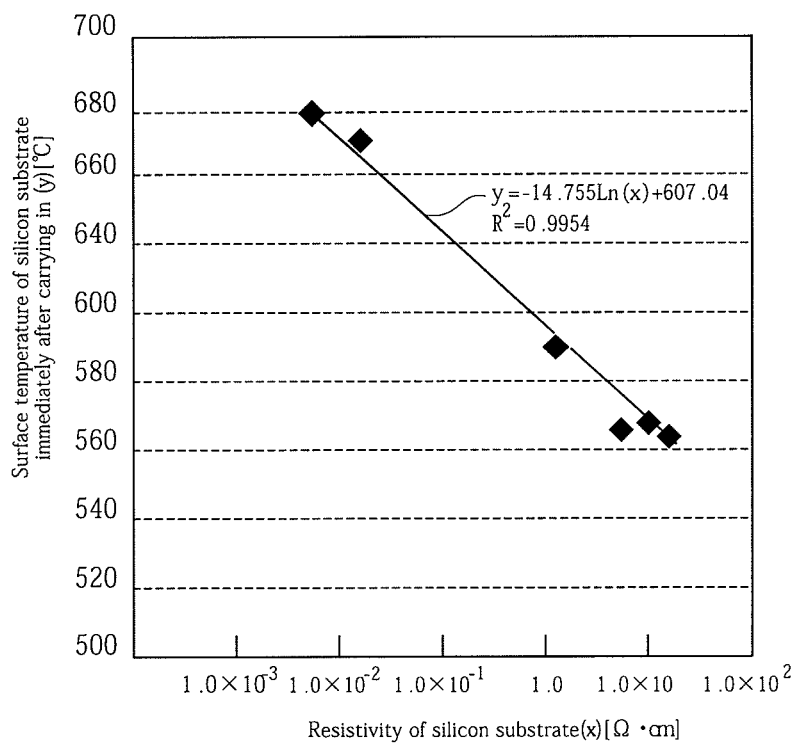
FIG. 5 is a view showing a relationship between a resistivity of the silicon wafer and a temperature of the front surface of the silicon wafer immediately after carried into the epitaxial growth apparatus.

FIG. 5 is a view showing a value obtained by measuring a temperature of the silicon wafer when five seconds elapsed after carriage of the silicon wafer into the reactor in which a temperature of the susceptor is 750° C., and this drawing illustrates a relationship between a resistivity of the silicon wafer and a surface temperature of the silicon wafer immediate after carriage into the epitaxial growth apparatus. As shown in FIG. 5, a difference in surface temperature of the silicon wafer immediate after carriage into the reactor is produced between a low-resistivity $P^+$ or $P^{++}$ substrate that has a low boron concentration and a resistivity of 0.005 to 0.020 Ω·cm and a high-resistivity $P^-$ substrate that has a resistivity of 8 to 12 Ω·cm. A relationship between this surface temperature of the silicon wafer and a resistivity of the silicon wafer is represented by the following Expression (1) where y is a surface temperature of the silicon wafer and x is a resistivity of the silicon wafer. $R^2$ is a calculated correlation coefficient, and a logarithmic high correlation can be observed in a surface temperature of the silicon wafer and a resistivity of the silicon wafer.

$$y = -14.755 \, \text{Ln}\,(x) + 607.04 \quad (1)$$

$$R^2 = 0.9954$$

Based on this expression, a temperature rise rate differs depending on a resistivity of the silicon wafer, and a time required for recovery after occurrence of warpage also differs depending on a resistivity of the silicon wafer when the silicon wafer is carried into the reactor set to the same temperature.

In the present invention, adjusting a susceptor temperature in accordance with a resistivity of the silicon wafer enables remedying warpage produced in the silicon wafer in a fixed time range even if the silicon wafer has a resistivity different from that of another silicon wafer. As a result, a general epitaxial manufacturing apparatus in which a time from carriage of the silicon wafer into the reactor to transfer of the same onto the susceptor or a time from transfer of the silicon wafer onto the lift pins to transfer of the same onto the susceptor is fixed can solve the above-described problem without requiring a complicated apparatus or reconstruction thereof like that adopted in the conventional technology.

A warpage amount of the silicon wafer is affected by a square of a radius. Therefore, even if an influence of a thickness of the silicon wafer is taken into consideration, since a warpage amount of a silicon wafer having an outside diameter of 300 mm due to a temperature becomes larger than that of a silicon wafer having an outside diameter of 200 mm and such a silicon wafer is apt to come into contact with the carrier blade or the susceptor, the present invention can be effectively utilized in a silicon wafer preferably having an outside diameter of 300 mm or above, or more preferably 450 mm or above.

When a resistivity of the silicon wafer is 0.005 to 0.020 $\Omega \cdot cm$, i.e., when a $P^+$ or $P^{++}$ substrate is used, it is preferable to adjust a temperature of the susceptor to 775±25° C. When a temperature of the susceptor is less than a lower limit value, the front surface and the back surface of the silicon wafer do not have a uniform temperature in a period from transfer onto the lift pins to transfer onto the susceptor after the silicon wafer is carried into the reactor, warpage is not corrected in this period, and hence the effect of the present invention is hardly obtained. Additionally, when a temperature of the susceptor exceeds an upper limit value, warpage of the silicon wafer is corrected on the carrier blade, and particles are apt to be generated from friction of the carrier blade and the back surface edge portion of the silicon wafer. Among others, a temperature of 775±10° C. is particularly preferable.

When a resistivity of the silicon wafer is 8 to 12 $\Omega \cdot cm$, i.e., when a $P^-$ substrate is used, it is preferable to adjust a temperature of the susceptor to 825±25° C. is preferable. When a temperature of the susceptor is less than the lower limit value, the front surface and the back surface of the silicon wafer do not have a uniform temperature in the period from transfer onto the lift pins to transfer onto the susceptor after the silicon wafer is carried into the reactor, warpage is not corrected in this period, and hence the effect of the present invention is hardly obtained. Further, when a temperature of the susceptor exceeds the upper limit value, warpage of the silicon wafer is corrected on the carrier blade, and there easily occurs an inconvenience that particles are produced from friction of the carrier blade and the back surface edge portion of the silicon wafer, scratches are made on the silicon wafer, or a displacement occurs when the silicon wafer is loaded onto the susceptor. Among others, a temperature of 825±10° C. is particularly preferable.

EXAMPLE

Next, examples according to the present invention are explained together with comparative examples.

Example 1

An epitaxial wafer was manufactured as a silicon wafer by using a $P^+$ or $P^{++}$ substrate having a resistivity of 0.005 to 0.020 $\Omega \cdot cm$. The utilized silicon wafer has an outside diameter of 300 mm, a thickness of 770 to 830 μm, and a crystal axis (100).

Specifically, as shown in FIG. 1, a silicon wafer 21 having an ordinary temperature serving as a substrate for an epitaxial wafer was first loaded on a carrier blade 22 of a lamp heating type lateral single wafer processing epitaxial growth apparatus (manufactured by AMAT) having an automatic carriage function, and carried into a reactor 20 having a high temperature in which a temperature of a susceptor 24 is set to 750° C. Subsequently, the silicon wafer 21 carried into the reactor 20 was temporarily relayed by lift pins 23 disposed in the reactor 20 as shown in FIG. 2, and then the silicon wafer 21 relayed by the lift pins 23 was transferred onto the susceptor 24 as depicted in FIG. 3. It is to be noted that a time from carriage of the silicon wafer 21 into the reactor 20 to transfer of the same onto the susceptor 24 is fixed to a definite range, i.e., 30 to 40 seconds, which is typically 35 seconds in the adopted epitaxial growth apparatus. Furthermore, a time from transfer of the silicon wafer 21 onto the lift pins 23 to transfer of the same onto the susceptor 24 is fixed to a definite range, i.e., 20 to 30 seconds, which is typically 25 seconds.

Subsequently, in the state depicted in FIG. 3, a temperature of the susceptor 24 was increased to 1150° C., an SiHCl gas was flowed into the reactor 20 while rotating the susceptor 24 at a rate of 32 rpm, an epitaxial film having a thickness of 2 μm was grown on the silicon wafer 21, and 25 epitaxial wafers were manufactured.

Example 2

25 epitaxial wafers were manufactured in the same manner as Example 1 except that a temperature of the susceptor 24 was set to 775° C. to carry the silicon wafer 21 into the reactor 20.

Example 3

25 epitaxial wafers were manufactured in the same manner as Example 1 except that a temperature of the susceptor 24 was set to 800° C. to carry the silicon wafer 21 into the reactor 20.

Comparative Example 1

25 epitaxial wafers were manufactured in the same manner as Example 1 except that a temperature of the susceptor 24 was set to 700° C. to carry the silicon wafer 21 into the reactor 20.

Comparative Example 2

25 epitaxial wafers were manufactured in the same manner as Example 1 except that a temperature of the susceptor 24 was set to 825° C. to carry the silicon wafer 21 into the reactor 20.

Comparative Example 3

25 epitaxial wafers were manufactured in the same manner as Example 1 except that a temperature of the susceptor 24 was set to 850° C. to carry the silicon wafer 21 into the reactor 20.

Comparative Text and Evaluation 1

In regard to each of the epitaxial wafers manufactured in Examples 1 to 3 and Comparative Examples 1 to 3, a laser beam scattering type particle counter (SP1: manufactured by KLA-Tencor) was used to measure the number of LPDs on an epitaxial wafer surface. The following Table 1 shows its results. It is to be noted that measurement of the number of LPDs was carried out with respect to each of the manufactured epitaxial wafers with an LPD size of the laser beam scattering type particle counter being set to 0.09 μm or above and 1 μm or above. Moreover, each measurement value of the number of LPDs shown in Table 1 represents an average value per epitaxial wafer manufactured in Examples 1 to 3 and Comparative Examples 1 to 3.

TABLE 1

|  | Temperature | Number of LPDs (average value per silicon wafer) | |
|---|---|---|---|
|  | [° C.] | 0.09 μm or above | 1 μm or above |
| Example 1 | 750 | 0.9 | 0.3 |
| Example 2 | 775 | 0.9 | 0.2 |
| Example 3 | 800 | 0.9 | 0.2 |
| Comparative example 1 | 700 | 1.9 | 1.1 |
| Comparative example 2 | 825 | 1.1 | 0.4 |
| Comparative example 3 | 850 | 1.6 | 1.0 |

As apparent from Table 1, in case of the epitaxial wafer manufactured with the P+ or P++ substrate being used as a silicon wafer having a resistivity of 0.005 to 0.020 Ω·cm, in each of Examples 1 to 3 where a temperature of the susceptor at the time of carrying the silicon wafer into the reactor was set to 775±25° C., since warpage produced in the silicon wafer in a period from transfer onto the lift pins to transfer onto the susceptor after carrying the silicon wafer into the reactor was corrected, the detected number of LPDs was smaller than those in Comparative Examples 1 to 3. On the other hand, in Comparative Example 1 where a temperature of the susceptor was set to 700° C., warpage produced in the silicon wafer was not corrected before transfer onto the susceptor, and particles were generated from friction of the back surface edge portion of the silicon wafer and the susceptor. Therefore, more LPDs were detected in each manufactured epitaxial wafer than Examples 1 to 3. Further, in each of Comparative Examples 2 and 3 where a temperature of the susceptor was set to 825° C. to 850° C., since warpage produced in the silicon wafer on the carrier blade was remedied and particles were generated from friction of the back surface edge portion of the silicon wafer and the carrier blade, more LPDs were detected than Examples 1 to 3. Therefore, it was confirmed that setting a temperature of the susceptor at the time carrying into the reactor to 775±25° C. is preferable when the P+ or P++ substrate having a resistivity of 0.005 to 0.020 Ω·cm was used as the silicon wafer.

Example 4

A P− substrate having a resistivity of 8 to 12 Ω·cm was used to manufacture an epitaxial wafer as a silicon wafer. The utilized silicon wafer has an outside diameter of 300 mm, a thickness of 825 μm, and a crystal axis (100).

25 Epitaxial wafers were manufactured in the same manner as Example 1 except that a temperature of the susceptor 24 was set to 800° C. to carry the silicon wafer 21 into the reactor 20.

Example 5

25 epitaxial wafers were manufactured in the same manner as Example 4 except that a temperature of the susceptor 24 was set to 825° C. to carry the silicon wafer 21 into the reactor 20.

Example 6

25 epitaxial wafers were manufactured in the same manner as Example 4 except that a temperature of the susceptor 24 was set to 850° C. to carry the silicon wafer 21 into the reactor 20.

Comparative Example 4

25 epitaxial wafers were manufactured in the same manner as Example 4 except that a temperature of the susceptor 24 was set to 700° C. to carry the silicon wafer 21 into the reactor 20.

Comparative Example 5

25 epitaxial wafers were manufactured in the same manner as Example 4 except that a temperature of the susceptor 24 was set to 750° C. to carry the silicon wafer 21 into the reactor 20.

Comparative Example 6

25 epitaxial wafers were manufactured in the same manner as Example 4 except that a temperature of the susceptor 24 was set to 750° C. to carry the silicon wafer 21 into the reactor 20.

Comparative Text and Evaluation 2

In regard to each of the epitaxial wafers manufactured in Examples 4 to 6 and Comparative Examples 4 to 6, a laser beam scattering type particle counter (SP1: manufactured by KLA-Tencor) was used to measure the number of LPDs on an epitaxial wafer surface. The following Table 2 shows its results. It is to be noted that measurement of the number of LPDs was carried out with an LPD size of the laser beam scattering type particle counter being set to 0.09 μm or above and 1 μm or above. Moreover, each measurement value of the number of LPDs shown in Table 2 represents an average value per epitaxial wafer manufactured in Examples 4 to 6 and Comparative Examples 4 to 6.

TABLE 2

|  | Temperature | Number of LPDs (average value per silicon wafer) | |
|---|---|---|---|
|  | [° C.] | 0.09 μm or above | 1 μm or above |
| Example 4 | 800 | 5.6 | 2.1 |
| Example 5 | 825 | 3.2 | 0.3 |
| Example 6 | 850 | 3.2 | 0.3 |
| Comparative example 4 | 700 | 9.1 | 3.2 |
| Comparative example 5 | 750 | 8.8 | 2.9 |
| Comparative example 6 | 775 | 8.8 | 2.9 |

As apparent from Table 2, in case of the epitaxial wafer manufactured with the P− substrate having a resistivity of 8 to 12 Ω·cm being used as a silicon wafer, in each of Examples 4 to 6 where a temperature of the susceptor at the time of carrying the silicon wafer into the reactor was set to 825±25° C., since warpage produced in the silicon wafer in a period from transfer onto the lift pins to transfer onto the susceptor after carrying the silicon wafer into the reactor was corrected, the detected number of LPDs was smaller than those in Comparative Examples 4 to 6. On the other hand, in each of Comparative Examples 4 to 6 where a temperature of the susceptor was set to be less than 800° C., warpage produced in the silicon wafer was not corrected before transfer onto the susceptor, and particles were generated from friction of the back surface edge portion of the silicon wafer and the susceptor. Therefore, more LPDs were detected in each manufactured epitaxial wafer than Examples 4 to 6. Therefore, it was confirmed that setting a temperature of the susceptor at the time of carrying into the reactor to 825±25° C. is preferable when the P⁻ substrate having a resistivity of 8 to 12 Ω·cm was used as the silicon wafer.

What is claimed is:

1. A method for manufacturing an epitaxial wafer by which an epitaxial layer is formed on a surface of a silicon wafer arranged in a reactor by distributing a raw material gas in the reactor, wherein:
a temperature of a susceptor in the period from the time of carrying the silicon wafer into the reactor until the time of transferring the silicon wafer to the susceptor is adjusted in accordance with a resistivity and temperature rise rate of the silicon wafer;
when the resistivity of the silicon wafer is 0.005 to 0.020 Ω·cm, a temperature of the susceptor in the period from the time of carrying the silicon wafer into the reactor until the time of transferring the silicon wafer to the susceptor is adjusted to 775±25° C.; and
an average number of light point defects having a size of 0.09 μm or greater per silicon wafer is 0.9 or less.

2. The method according to claim 1, wherein the temperature of the susceptor in the period from the time of carrying the silicon wafer into the reactor to the time of transferring the silicon wafer to the susceptor is adjusted to a predetermined temperature in accordance with the resistivity and temperature rise rate of the silicon wafer, such that warpage produced in the silicon wafer is remedied in the period from the time of transferring the silicon wafer onto lift pins, which temporarily relay the silicon wafer, to the time of transferring the silicon wafer onto the susceptor when carrying the silicon wafer into the reactor.

3. The method according to claim 1, wherein the temperature of the susceptor in the period from the time of carrying the silicon wafer into the reactor to the time of transferring the silicon wafer to the susceptor is adjusted in accordance with the resistivity and temperature rise rate of the silicon wafer such that warpage produced in the silicon wafer is remedied.

4. The method according to claim 1, wherein the temperature of the susceptor in the period from the time of carrying the silicon wafer into the reactor to the time of transferring the silicon wafer to the susceptor is adjusted in accordance with the resistivity and temperature rise rate on front and back surfaces of the silicon wafer.

5. A method for manufacturing an epitaxial wafer by which an epitaxial layer is formed on a surface of a silicon wafer arranged in a reactor by distributing a raw material gas in the reactor, wherein:
a temperature of a susceptor in the period from the time of carrying the silicon wafer into the reactor until the time of transferring the silicon wafer to the susceptor is adjusted in accordance with a resistivity and temperature rise rate of the silicon wafer;
when the resistivity of the silicon wafer is 8 to 12 Ω·cm, a temperature of the susceptor in the period from the time of carrying the silicon wafer into the reactor until the time of transferring the silicon wafer to the susceptor is adjusted to 825±25° C.; and
an average number of light point defects having a size of 0.09 μm or greater per silicon wafer is 5.6 or less.

* * * * *